(12) United States Patent
Dietrich

(10) Patent No.: US 7,324,620 B2
(45) Date of Patent: Jan. 29, 2008

(54) TECHNIQUES TO REDUCE TRANSMITTED JITTER

(75) Inventor: Casper Dietrich, Roskilde (DK)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/557,355

(22) Filed: Nov. 7, 2006

(65) Prior Publication Data

US 2007/0064853 A1     Mar. 22, 2007

Related U.S. Application Data

(63) Continuation of application No. 10/198,581, filed on Jul. 17, 2002, now Pat. No. 7,151,813.

(51) Int. Cl.
*H04L 7/00* (2006.01)

(52) U.S. Cl. .................. 375/372; 375/373; 370/516

(58) Field of Classification Search ........ 375/370–373, 375/355, 359, 376; 370/503, 508, 505–506, 370/516–518; 327/153–156, 147, 158, 161
See application file for complete search history.

(56) References Cited

U.S. PATENT DOCUMENTS

| | | | |
|---|---|---|---|
| 3,825,683 A | 7/1974 | Pitroda et al. |
| 4,054,747 A | 10/1977 | Pachynski, Jr. |
| 4,862,451 A | 8/1989 | Closs et al. |
| 5,081,655 A | 1/1992 | Long |
| 5,276,688 A | 1/1994 | Urbansky |
| 5,608,357 A | 3/1997 | Ta et al. |
| 5,864,250 A | 1/1999 | Deng |
| 5,952,888 A | 9/1999 | Scott |
| 6,005,901 A | 12/1999 | Linz |
| 6,061,410 A | 5/2000 | Linz |
| 6,061,778 A | 5/2000 | Sano et al. |
| 6,256,069 B1 | 7/2001 | Rosen et al. |
| 6,324,235 B1 | 11/2001 | Savell et al. |
| 6,347,128 B1 | 2/2002 | Ransijn |
| 6,351,508 B1 | 2/2002 | Shishkoff et al. |
| 6,509,766 B1 | 1/2003 | Pomichter et al. |
| 6,509,773 B2 | 1/2003 | Buchwald et al. |
| 6,744,787 B1 | 6/2004 | Schatz et al. |
| 2002/0021719 A1 | 2/2002 | Acimovic |
| 2002/0075980 A1 | 6/2002 | Tang et al. |
| 2002/0075981 A1 | 6/2002 | Tang et al. |
| 2003/0063567 A1 | 4/2003 | Dehart |
| 2003/0190003 A1 | 10/2003 | Fagerhoj |

OTHER PUBLICATIONS

Alexander, J.D.H., "Clock Recovery from Random Binary Signals", Electronics Letters, vol. 11, No. 22, Oct. 30, 1975, p. 541.

*Primary Examiner*—Khanh C. Tran
(74) *Attorney, Agent, or Firm*—Caven & Aghevli LLC

(57) ABSTRACT

A re-timer system that may include a phase recoverer ("PR"), first-in-first-out device ("FIFO") and retime clock multiplication unit ("CMU"). PR may receive an input signal that suffers from jitter. PR may generate a phase matched signal having substantially the same phase as that of the input signal. To generate the phase matched signal, PR may use a clock signal provided by a single side band oscillator, CMU, or a clock signal having substantially the same level of jitter as that of the input signal to generate the phase matched signal. FIFO may sample the phase matched signal and store such samples. CMU may request and output samples from the FIFO at a frequency determined by a reference clock signal.

21 Claims, 6 Drawing Sheets

TECHNIQUES TO REDUCE TRANSMITTED JITTER

CROSS-REFERENCE TO RELATED APPLICATIONS

This application is a continuation of U.S. patent application Ser. No. 10/198,581, filed Jul. 17, 2002, now became U.S. Pat. No. 7,151,813.

FIELD

The subject matter disclosed herein generally relates to communications systems and more particularly to techniques to reduce signal jitter.

DESCRIPTION OF RELATED ART

Jitter is the general term used to describe distortion caused by variation of a signal from its reference timing position in a communications system. In an ideal system, bits arrive at time increments that are integer multiples of a bit repetition time. In an operational system, however, pulses typically arrive at times that deviate from these integer multiples. This deviation may cause errors in the recovery of data, particularly when data is transmitted at high speeds. The deviation or variation may be in the amplitude, time, frequency or phase of this data. Jitter may be caused by a number of phenomena, including inter-symbol interference, frequency differences between the transmitter and receiver clock, noise, and the non-ideal behavior of the receiver and transmitter clock generation circuits.

Jitter is a problem of particular import in digital communications systems for several reasons. First, jitter causes the received signal to be sampled at a non-optimal sampling point. This occurrence reduces the signal-to-noise ratio at the receiver and thus limits the information rate. Second, in practical systems, each receiver must extract its received sampling clock from the incoming data signal. Jitter makes this task significantly more difficult. Third, in long distance transmission systems, where multiple repeaters reside in the link, jitter accumulates.

BRIEF DESCRIPTION OF THE DRAWINGS

Note that use of the same reference numbers in different figures indicates the same or like elements.

DETAILED DESCRIPTION

Figure 1A:
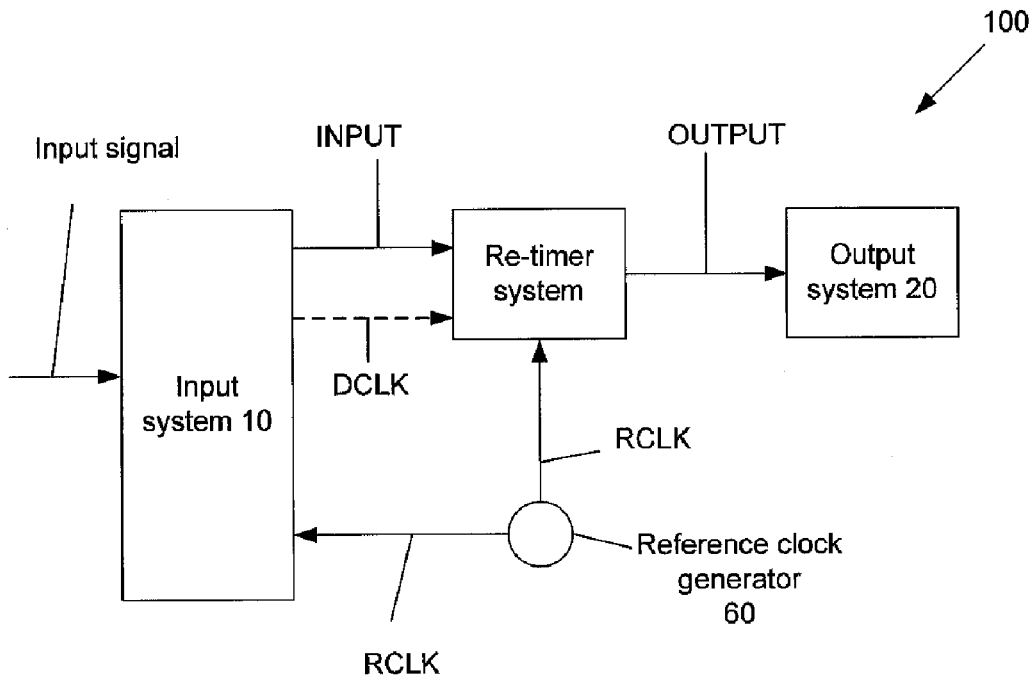
FIG. 1A depicts in a re-timer system an example system that may use an embodiment of the present invention

FIG. 1A depicts an example system that may use a re-timer system, in accordance with an embodiment of the present invention. Input system 10 may provide an input signal (signal INPUT) and a data clock signal (signal DCLK). Input system 10 may, but does not have to, be any system that introduces jitter into signals or transfers signals that suffer from jitter such as a forward clock system, i.e., a system that provides a signal and corresponding clock signal used by the forward clock system to time such signal (the clock signal is depicted as DCLK). A reference clock signal generator 60 may provide a reference clock signal (signal RCLK) to the input system 10 and re-timer system. Re-timer system may provide an output signal (signal OUTPUT) to output system 20.

For example, the system 100 of FIG. 1A may be used in a transmitter in an optical network compliant for example with OTN, SONET and/or SDH; a router or switch that transmits packets or frames; a transmitter that transmits signals encoded in accordance with 10 or 40 gigabit Ethernet (described for example in IEEE 802.3 and its related standards); and/or a wireless signal transmitter. When system 100 is used as a transmitter in an optical network, it may be operate in compliance for example with ITU-T Recommendation G.709 Interfaces for the Optical Transport Network (OTN) (2001); ANSI T1.105, Synchronous Optical Network (SONET) Basic Description Including Multiplex Structures, Rates, and Formats; Bellcore Generic Requirements, GR-253-CORE, Synchronous Optical Network (SONET) Transport Systems: Common Generic Criteria (A Module of TSGR, FR-440), Issue 1, December 1994; ITU Recommendation G.872, Architecture of Optical Transport Networks, 1999; ITU Recommendation G.825, "Control of Jitter and Wander within Digital Networks Based on SDH" March, 1993; ITU Recommendation G.957, "Optical Interfaces for Equipment and Systems Relating to SDH", July, 1995; ITU Recommendation G.958, Digital Line Systems based on SDH for use on Optical Fibre Cables, November, 1994; and/or ITU-T Recommendation G.707, Network Node Interface for the Synchronous Digital Hierarchy (SDH) (1996).

Figure 1B:
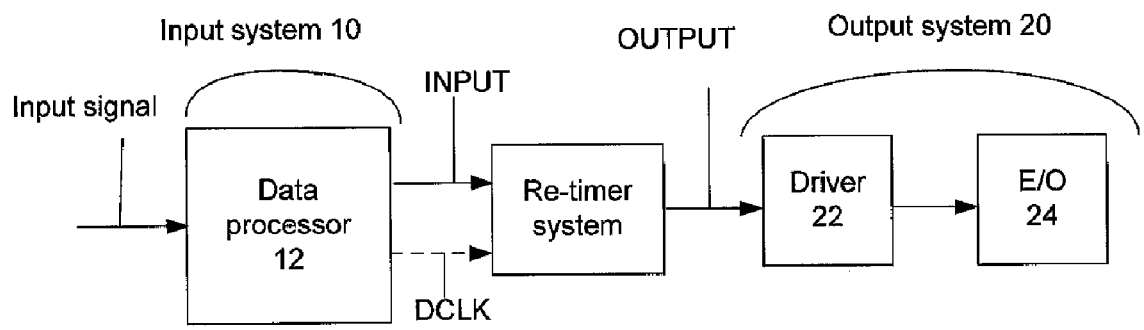
FIG. 1B depicts an example of an input system and output system.

When system 100 is used in a transmitter in an optical network, FIG. 1B depicts example implementations of the input system 10 and output system 20. Input system 10 may include a data processor 12 that may perform media access control (MAC) management in compliance for example with Ethernet; framing and wrapping in compliance for example with ITU-T G.709; and/or forward error correction (FEC) processing, for example in accordance with ITU-T G.975; and/or other layer 2 processing. Output system 20 may include a driver 22 and an electronic-to-optical signal converter ("E/O") 24. Driver 22 may receive signals from the re-timer system. Driver 22 and E/O 24 may together convert electrical signals into stable optical signals and amplify such signals. E/O 24 may transmit such optical signals to an optical network.

For example, some embodiments of the present invention may be used by the LXT16723 products available from Intel Corporation.

Figure 2:
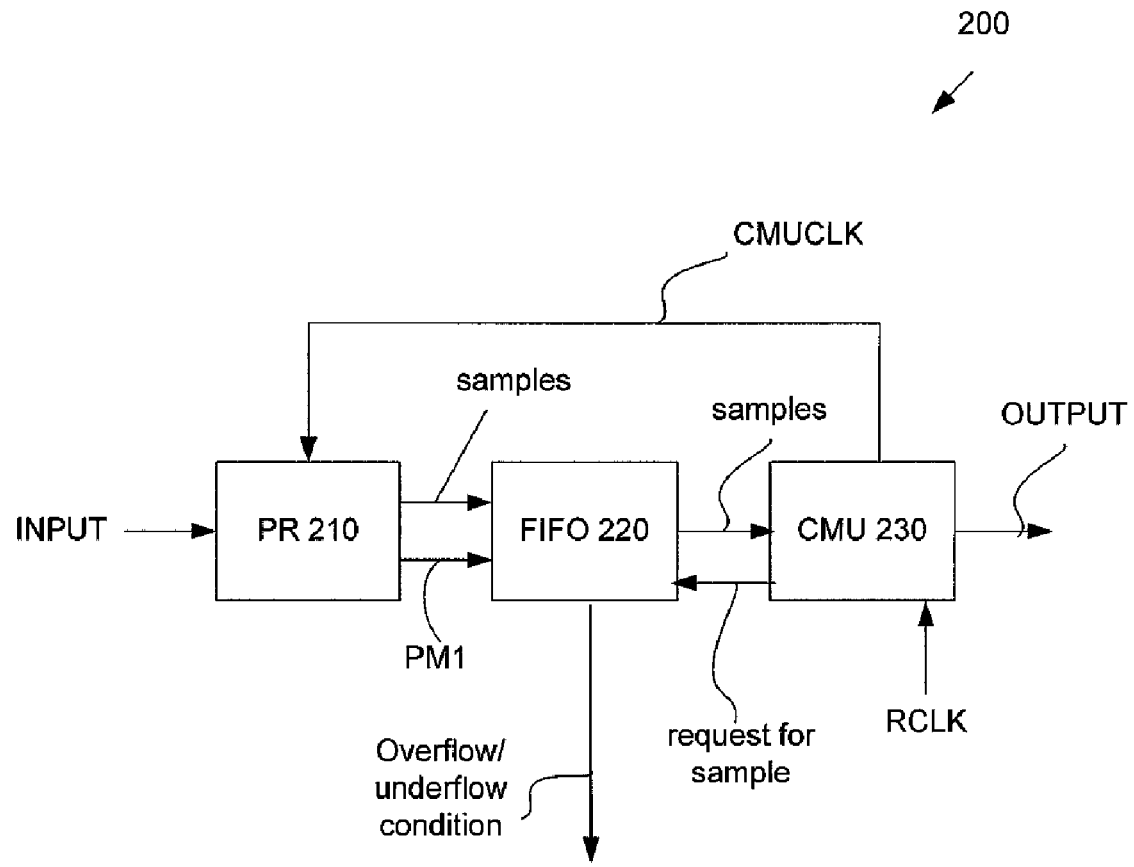
FIG. 2 depicts an embodiment of the present invention.

FIG. 2 depicts an embodiment of the present invention in re-timer system 200. Re-timer system 200 may include a phase recoverer ("PR") 210, first-in-first-out device ("FIFO") 220 and retime clock multiplication unit ("CMU") 230. PR 210 may receive signal INPUT. Signal INPUT may be any electrical signal and may include data. PR 210 may generate a phase matched signal (signal PM1) having substantially the same phase as that of the signal INPUT. PR 210 may use a clock signal (CMUCLK) provided, for example but not necessarily, by CMU 230 to generate the signal PM1. FIFO 220 may receive samples of the signal INPUT and store such samples. CMU 230 may request and output samples from the FIFO 220 at a frequency determined by RCLK (or some multiple or fraction thereof).

Figure 3:
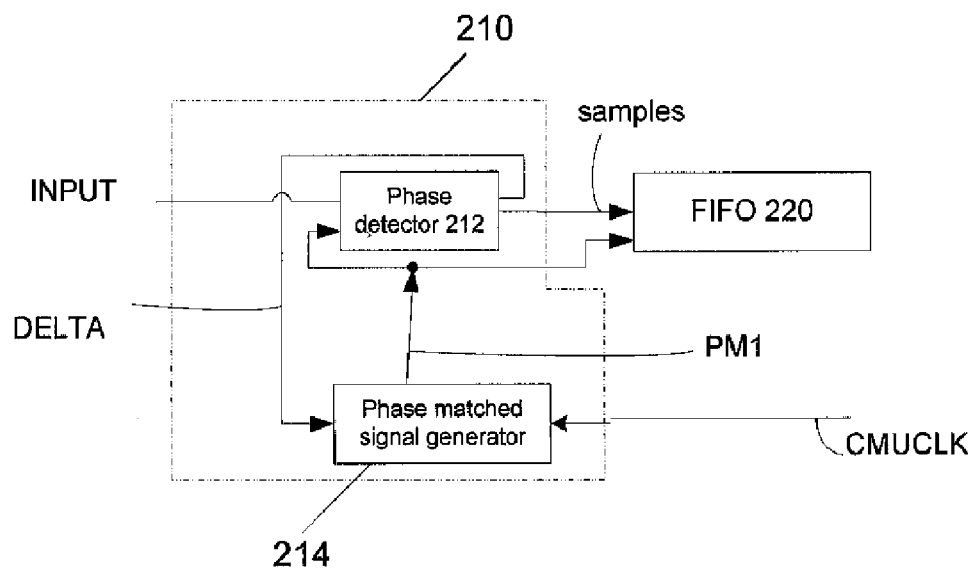
FIG. 3 depicts an example implementation of a phase recoverer that may be used in a re-timer system in accordance with an embodiment of the present invention.

FIG. 3 depicts one possible implementation of the PR 210. PR 210 may include a phase detector 212 and a phase matched signal generator 214. The phase detector 212 may compare the phase of the signal INPUT with the phase of a signal PM1. The phase detector 212 may indicate whether the transitions of the signal INPUT lead or lag those of signal PM1. The phase detector 212 may be implemented as an Alexander ("bang-bang") type filter. One implementation of the Alexander phase detector is described in Electronic Letters by J. D. H. Alexander in an article entitled, Clock Recovery From Random Binary Signals, Volume 11, page 541-542, October 1975. The phase detector 212 may output to the phase matched signal generator 214 a phase difference signal (shown as DELTA) that represents the phase relationship of the signal INPUT with signal PM1. The phase detector 212 may also output to the FIFO 220 samples of the signal INPUT.

Phase matched signal generator 214 may receive a signal DELTA from the phase detector 212 and receive signal CMUCLK. CMU 230 of re-timer system 200 may provide signal CMUCLK, although, other clock sources may be used. Phase matched signal generator 214 may output a signal PM1 that has substantially the same phase as that of the signal INPUT and a frequency substantially the same as that of CMUCLK. The phase matched signal generator 214 may output such signal PM1 to the FIFO 220. FIFO 220 may read samples from phase detector 212 according to edge transitions of signal PM1.

Figure 4:
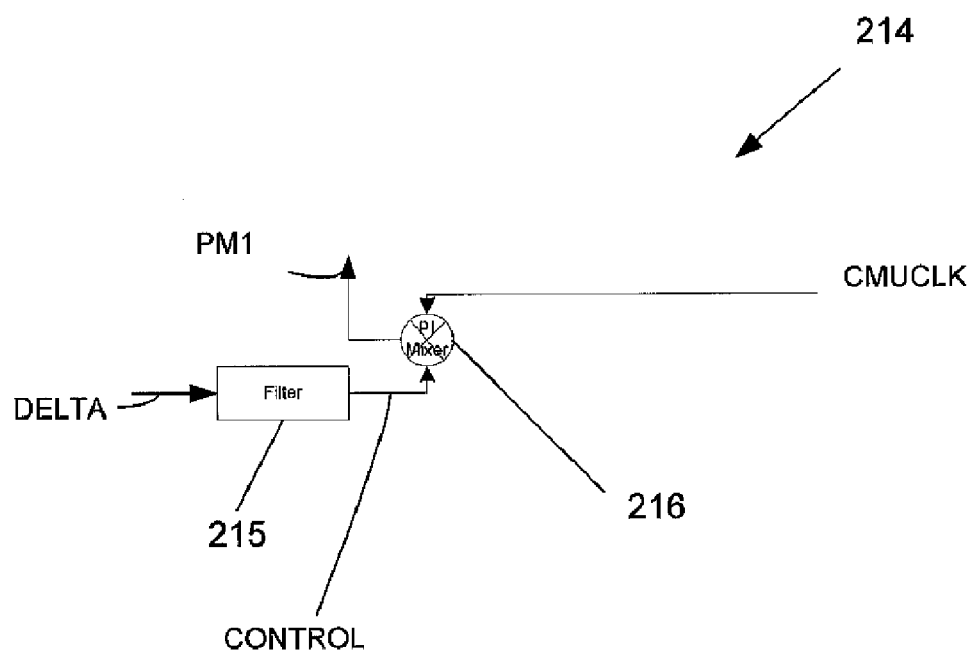
FIG. 4 depicts one possible implementation of a phase matcher in accordance with an embodiment of the present invention.

FIG. 4 depicts one possible implementation of phase matched signal generator 214. Phase matched signal generator 214 may include filter 215 and phase interpolator ("PI") mixer 216. The filter 215 may receive a signal DELTA from the phase detector 212. The filter 215 may be implemented as a digital or analog loop filter. The filter 215 may transfer a portion of the signal DELTA that is within the passband of filter 215 (such transferred portion is shown as CONTROL).

The PI mixer 216 may receive the signal CONTROL from the filter 215 and receive signal CMUCLK. In one embodiment, the PI mixer 216 may adjust the phase of signal CMUCLK for phase differences between zero (0) and three hundred sixty (360) degrees. The filter 215 may command the PI mixer 216 to adjust the phase of the signal CMUCLK (such phase adjusted signal is depicted as signal PM1) based on the signal CONTROL to substantially match the phase of signal PM1 with that of the signal INPUT. The PI mixer 216 may output the signal PM1 to the FIFO 220.

In some systems, a phase recoverer may have a distinct voltage controlled oscillator to generate a clock signal that is fabricated on the same substrate as a clock generator that provides a clock signal having a different center frequency. One problem with such phase recoverer is that competition between the voltage controlled oscillator and the other clock generator may cause both to malfunction. The implementation of PR 210 described with respect to FIGS. 3 and 4 avoid such problem by utilizing a clock signal (CMUCLK) from a single clock source (for example, CMU 230).

Figure 5:
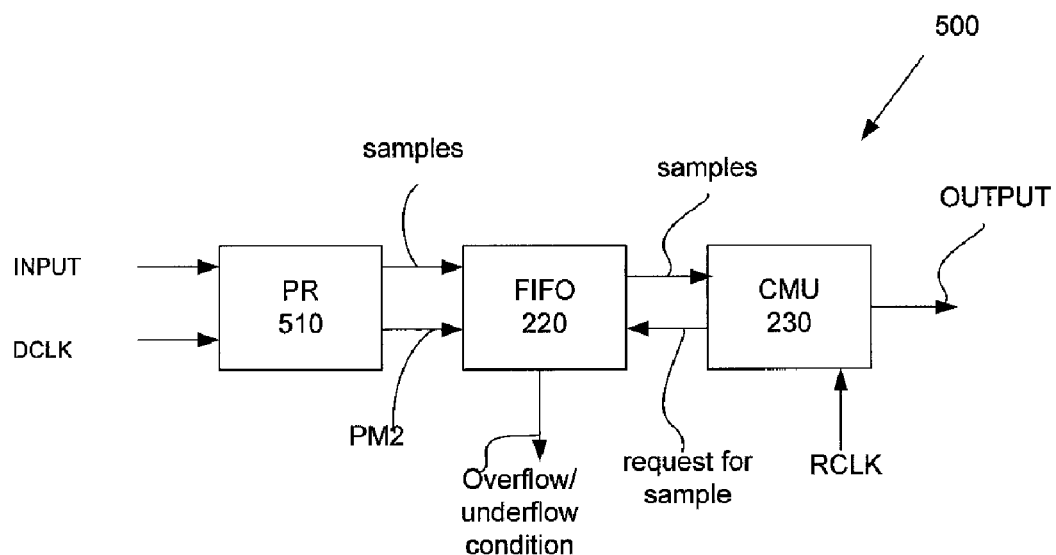
FIG. 5 depicts an embodiment of the present invention.

FIG. 5 depicts another embodiment of the present invention in re-timer system 500. Re-timer system 500 may include a PR 510, FIFO 220 and CMU 230. PR 510 may both receive a data clock signal (DCLK) and receive signal INPUT from a forward clock system. A forward clock system may be a system that provides a signal and corresponding clock signal used by the forward clock system to time such signal (the clock signal from the forward clock system is shown as DCLK). Forward clock systems may provide a clock signal and data signal that have the same or substantially the same amount of jitter. PR 510 may alter the phase of signal DCLK to have a phase substantially the same as that of the signal INPUT (such version of signal DCLK shown as signal PM2). FIFO 220 may receive samples of the signal INPUT and store such samples. CMU 230 may request and output samples from the FIFO 220 at a frequency determined by RCLK (or some multiple or fraction thereof).

Figure 6:
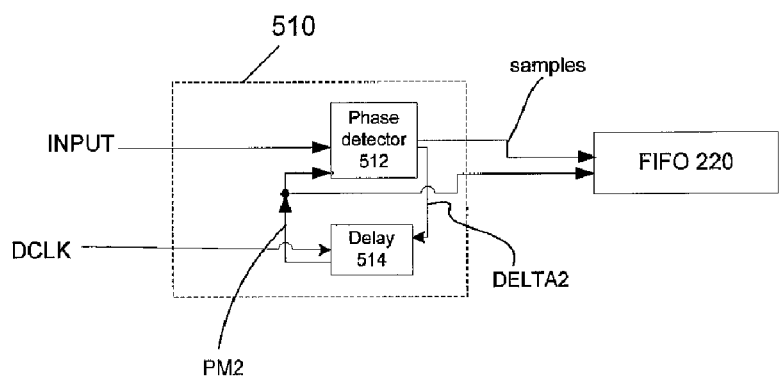
FIG. 6 depicts one possible implementation of a phase recoverer in accordance with an embodiment of the present invention.

FIG. 6 depicts one possible implementation of PR 510 in accordance with an embodiment of the present invention. PR 510 may include a phase detector 512 and a delay line 514. The phase detector 512 may be implemented as an Alexander ("bang-bang") type filter. The phase detector 512 may compare signal INPUT with signal PM2 and indicate whether the transitions of signal INPUT lead or lag those of signal PM2. The phase detector 512 may indicate the comparison using a signal shown as signal DELTA2. The phase detector 512 may also output to the FIFO 220 samples of the signal INPUT.

Delay line 514 may delay the phase of signal DCLK according to the magnitude or value of signal DELTA2 to match the phase of signal PM2 to that of signal INPUT. Delay line 514 may output signal PM2 to FIFO 220. FIFO 220 may read samples from phase detector 512 according to the edge transition of signal PM2.

For high frequency jitter, the PR 510 may more accurately reproduce jitter in an input signal than other implementations such as the PR 210 described with respect to FIG. 2. PR 510 uses a clock signal DCLK that has substantially the same amount of jitter as that of the signal INPUT. The PR 510 may not be able to adjust the phase of a signal among as great a range as other implementations such as PR 210.

Figure 7:
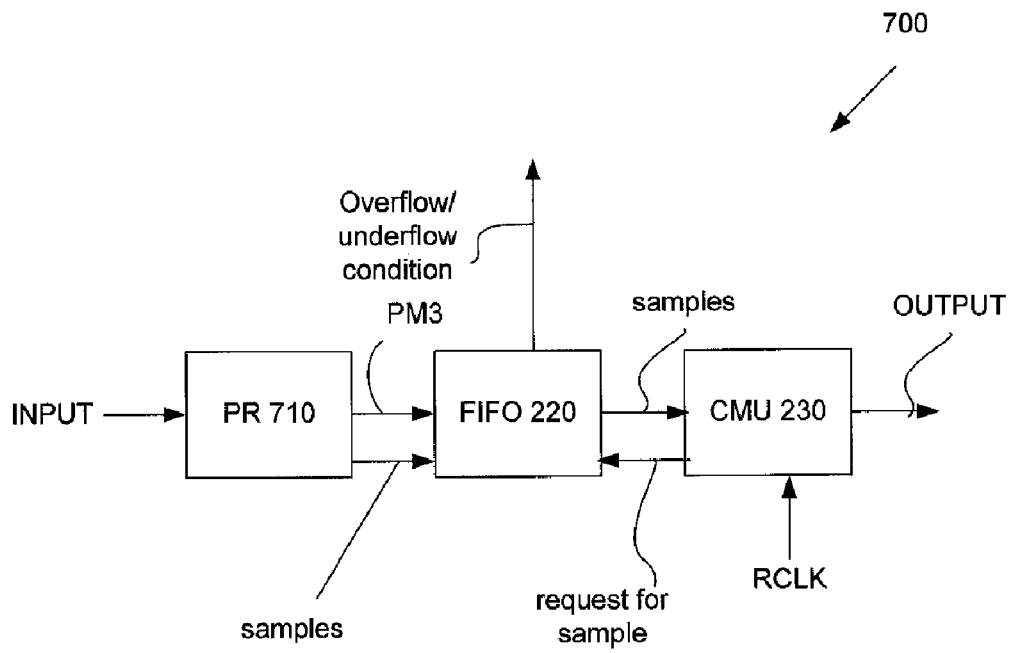
FIG. 7 depicts one possible implementation of a phase matcher in accordance with an embodiment of the present invention.

FIG. 7 depicts an example implementation of a re-timer system 700 in accordance with another embodiment of the present invention. Re-timer system 700 may include a PR 710, FIFO 220 and CMU 230. PR 710 may receive signal INPUT. PR 710 may generate a phase matched signal (signal PM3) having substantially the same phase as that of the signal INPUT. FIFO 220 may receive samples of the signal INPUT and store such samples. CMU 230 may request and output samples from the FIFO 220 at a frequency determined by RCLK (or some multiple or fraction thereof).

Figure 8:
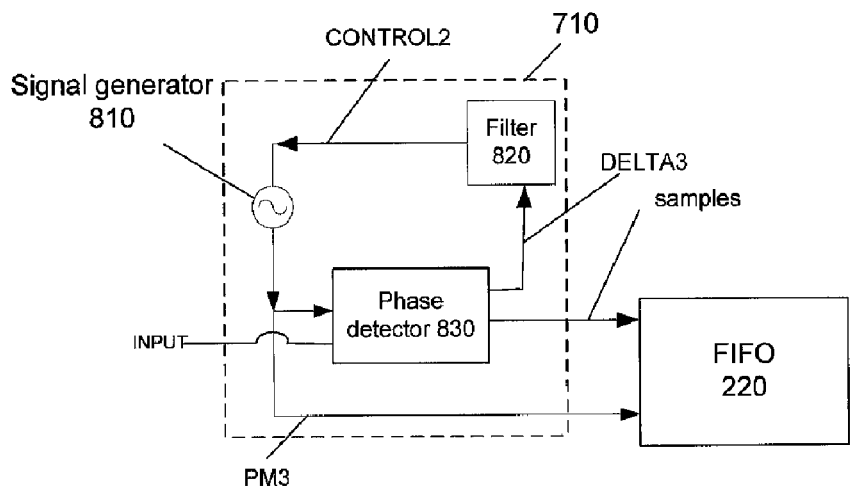
FIG. 8 depicts one possible implementation of a phase recoverer in accordance with an embodiment of the present invention.

FIG. 8 depicts one possible implementation of the PR 710. PR 710 may include a signal generator 810, filter 820, and phase detector 830. Signal generator 810 may generate a clock signal (shown as PM3). Signal generator 810 may be implemented as a voltage controlled oscillator (VCO) or a single side band (SSB) VCO. One suitable implementation of an SSB VCO is described in U.S. patent applications having Ser. Nos. 10/039,016 and 10/039,253 both filed Jan. 2, 2002, inventors Glenn and Altmann. Phase detector 830 may compare the phase of the signal PM3 with that of the signal INPUT. The phase detector 830 may output to the filter 820 a phase difference signal that may represent the phase relationship of the signal INPUT with the signal PM3

(such signal is shown as signal DELTA3). The phase detector 830 may further provide samples of the signal INPUT to the FIFO 220. The phase detector 830 may be implemented as an Alexander ("bang-bang") type filter.

Filter 820 may be implemented as a loop filter that may receive signal DELTA3 and transfers a portion of such signal DELTA3 within the passband of filter 820 (such transferred portion is depicted as signal CONTROL2). Signal generator 810 may receive signal CONTROL2 and may change the phase of signal PM3 in response to the magnitude of signal CONTROL2. Signal generator 810 may provide the signal PM3 to FIFO 220. FIFO 220 may read samples from phase detector 830 according to the edge transitions of signal PM3.

In some implementations of CMU 230 (such as that described with respect to FIG. 9), CMU 230 may include a voltage controlled oscillator that generates clock signals. One problem with such implementations is that competition between a voltage controlled oscillator of the PR 710 and the voltage controlled oscillator of the CMU 230 (so called "cross talk") may cause both to malfunction. In accordance with an embodiment of the present invention, CMU 230 and PR 710 use separate single side band (SSB) voltage controlled oscillators to generate clock signals and the voltage controlled oscillators generate clock signals having different center frequencies.

FIFO 220 may read samples of the input signal (INPUT) from the PR 210, PR 510, and/or PR 710 according to the transitions of a phase matched signal (e.g., signal PM1, PM2, or PM3). FIFO 220 may include a memory storage device to store samples as well as input and output circuitry to provide communication with PR 210, PR 510, and/or PR 710 and with CMU 230. FIFO 220 may transfer to CMU 230 samples of signal INPUT, for example, in response to requests from CMU 230.

FIFO 220 may generate a signal that indicates overflow or underflow state. Overflow state may occur when the FIFO does not have capacity to store samples without overwriting samples that have not been provided to CMU 230. Underflow state may occur when the CMU 230 requests samples stored by FIFO 220 when FIFO 220 has no samples that were not previously provided to the CMU 230. Another device may use such overflow/underflow state information to determine whether to ignore the output signal from the FIFO 210 because such output signal may not be accurate under overflow/underflow conditions.

CMU 230 may output a low jitter clock signal having a frequency of some multiple or fraction of a frequency of a reference clock signal (such as RCLK). CMU 230 may provide such low jitter clock signal to the PR 210 (for example as shown as CMUCLK in FIG. 2). CMU 230 may request samples from FIFO at a frequency (or some multiple or fraction thereof) set by a reference clock signal (e.g., signal RCLK). CMU 230 may output samples (shown as signal OUTPUT) at a frequency (or some multiple or fraction thereof) set by such reference clock signal (e.g., signal RCLK).

Figure 9:
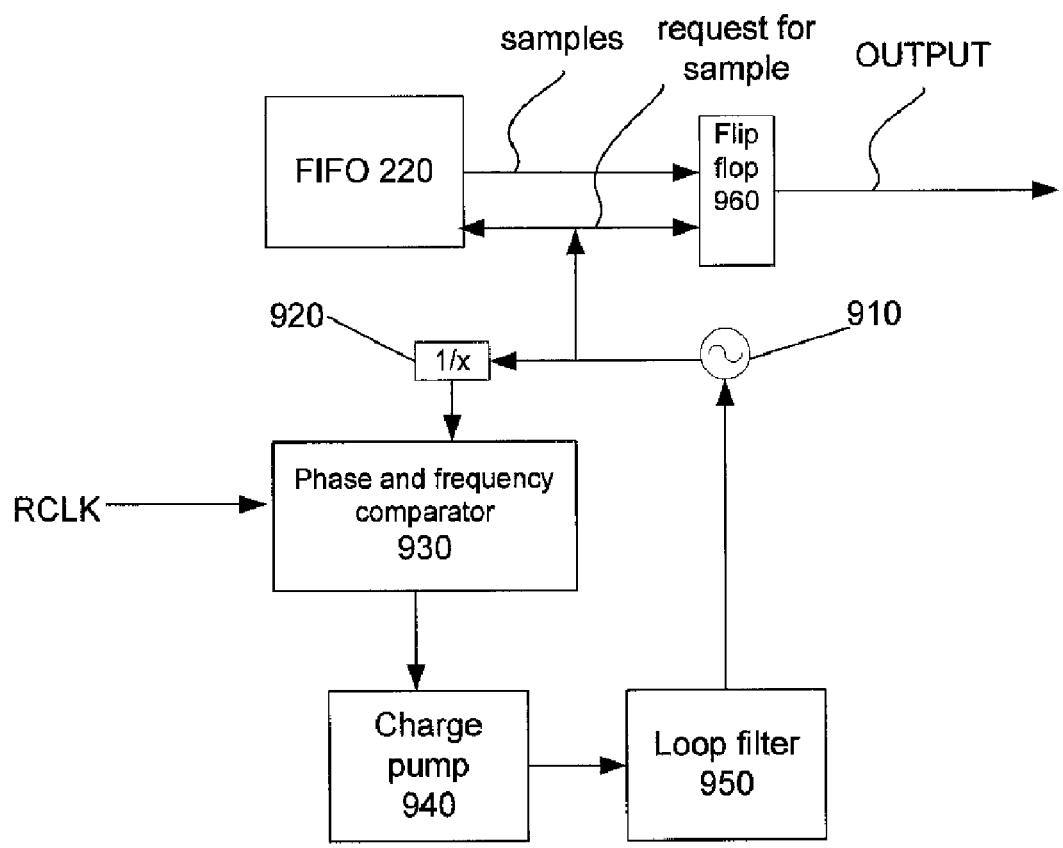
FIG. 9 depicts one possible implementation of a clock multiplication unit in accordance with an embodiment of the present invention.

FIG. 9 depicts one possible implementation of CMU 230. CMU 230 may include a signal generator 910, frequency divider 920, phase and frequency comparator 930, charge pump 940, loop filter 950, and flip flop 960. Signal generator 910 may generate a clock signal. In one implementation, signal generator 910 may be implemented as a single side band (SSB) voltage controlled oscillator that outputs a clock signal. For example, with respect to PR 710 (FIG. 7), CMU 230 and PR 710 may use different single side band (SSB) voltage controlled oscillators to generate clock signals having different center frequencies. Frequency divider 920 may reduce the frequency of the clock signal provided by signal generator 910 by an integer X to approximately match the frequency of such clock signal with that of a reference clock signal RCLK. Phase and frequency comparator 930 may compare the phases of RCLK and the frequency reduced clock signal provided by signal generator 910. Phase and frequency comparator 930 may provide the comparison to charge pump 940. Charge pump 940 may command signal generator 910 to increase or decrease the speed of its clock signal based upon the comparison so that phases of the frequency reduced clock signal (from frequency divider 920) and reference clock signal RCLK approximately match. Loop filter 950 may transfer commands from charge pump 940 to signal generator 910 that are inside of a passband. Flip flop 960 may receive samples from FIFO 220 and output samples (shown as OUTPUT) at a frequency based upon the clock signal from signal generator 910.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An apparatus comprising:
   a clock signal source to provide a clock signal and a first signal, wherein the first signal and clock signal include similar amounts of jitter;
   a phase recoverer to approximately match a phase of the clock signal to a phase of the first signal, wherein the phase recoverer is to output samples of the first signal and to output a phase adjusted clock signal, wherein the phase recoverer comprises:
      a detector to compare a phase of the first signal with a phase of the clock signal and output a comparison, and a delay locked loop to adjust a phase of the clock signal to approximately match the phase of the clock signal with the phase of the first signal based upon the comparison;
   a storage device to store samples based upon the phase adjusted clock signal; and
   a clock multiplication unit to transfer samples from the storage device.

2. The apparatus of claim 1, wherein the detector comprises an Alexander type phase detector.

3. The apparatus of claim 1, wherein the storage device is to indicate an overflow state.

4. The apparatus of claim 1, wherein the storage device is to indicate an underflow state.

5. The apparatus of claim 1, wherein the clock multiplication unit is to transfer samples based upon a second clock signal.

6. The apparatus of claim 1, further comprising an output device to receive samples from the clock multiplication unit, wherein the output device comprises:
   a driver to amplify samples; and
   an electrical-to-optical converter to convert the samples into optical format.

7. The apparatus of claim 1, wherein the clock signal source comprises logic to perform forward error correction on the first signal.

8. The apparatus of claim 1, wherein the clock signal source comprises logic to perform media access control on the first signal in compliance with Ethernet.

9. The apparatus of claim 1, wherein the clock signal source comprises logic to perform framing and wrapping on the first signal in compliance with ITU-T G.709.

10. An apparatus comprising:
a phase recoverer comprising a first single side band voltage controlled oscillator to provide a first clock signal, wherein the phase recoverer is to approximately match a phase of the first clock signal to a phase of a first signal and wherein the phase recoverer is to output samples of the first signal;
a storage device to store samples based upon the phase adjusted first clock signal; and
a clock multiplication unit comprising a second single side band voltage controlled oscillator to generate a second clock signal, wherein the first and second single side band voltage controlled oscillators operate at different center frequencies and wherein the clock multiplication unit is to transfer samples from the storage device based upon the second clock signal.

11. The apparatus of claim 10, further comprising an input device, wherein the input device comprises logic to perform forward error correction on the first signal.

12. The apparatus of claim 10, further comprising an input device, wherein the input device comprises logic to perform media access control on the first signal in compliance with Ethernet.

13. The apparatus of claim 10, further comprising an input device, wherein the input device comprises logic to perform framing and wrapping on the first signal in compliance with ITU-T G.709.

14. The apparatus of claim 10, further comprising an output device to receive samples from the clock multiplication unit:
a driver to amplify the samples; and
an electrical-to-optical converter to convert the samples into optical format.

15. The apparatus of claim 10, wherein the clock multiplication unit is to generate the second clock signal based upon a reference clock signal.

16. A method comprising the acts of:
matching a phase of a clock signal to a phase of an input signal, wherein the clock signal and input signal include similar amounts of jitter and wherein the matching comprises using in part a detector to compare a phase of the input signal with a phase of the clock signal and to output a comparison and comprises using in part a delay locked loop to approximately match the phase of the clock signal with the phase of the first signal based upon the comparison;
recording samples of the input signal based upon the phase matched clock signal; and
transferring samples of the input signal based upon the clock signal.

17. The method of claim 16, further comprising:
indicating an overflow state when the recorded samples exceed a threshold.

18. The method of claim 16, further comprising:
indicating an underflow state when the recorded samples exceed a threshold.

19. A method comprising:
matching a phase of a first clock signal to a phase of an input signal;
recording samples of the input signal based upon the phase matched first clock signal; and
transferring samples of the input signal based upon a second clock signal, wherein the first and second clock signals are based on clock signals from separate single side band voltage controlled oscillators operating at different frequencies.

20. The method of claim 19, further comprising:
indicating an overflow state when the recorded samples exceed a threshold.

21. The method of claim 19, further comprising:
indicating an underflow state when the recorded samples exceed a threshold.

* * * * *